United States Patent [19]
Linnenbrink et al.

[11] Patent Number: 5,327,138
[45] Date of Patent: Jul. 5, 1994

[54] CHARGE-MODE ANALOG TO DIGITAL CONVERTER

[75] Inventors: Thomas E. Linnenbrink, Monument, Colo.; Mark Wadsworth, Richardson, Tex.; Stephen D. Gaalema, Colorado Springs, Colo.

[73] Assignee: Q-Dot, Inc., Colorado Springs, Colo.

[21] Appl. No.: 21,953

[22] Filed: Feb. 23, 1993

Related U.S. Application Data

[63] Continuation of Ser. No. 784,277, Oct. 29, 1991, Pat. No. 5,189,423, which is a continuation-in-part of Ser. No. 560,949, Jul. 31, 1990, Pat. No. 5,061,927.

[51] Int. Cl.$^5$ ............... H03M 1/38; H01L 29/78
[52] U.S. Cl. ............... 341/172; 257/215
[58] Field of Search ............... 341/172, 155; 357/24; 307/444

[56] References Cited

U.S. PATENT DOCUMENTS

| | | |
|---|---|---|
| 4,072,939 | 2/1978 | Heller et al. |
| 4,087,812 | 5/1978 | Terman. |
| 4,120,035 | 10/1978 | Cases et al. |
| 4,130,894 | 12/1978 | Merrill et al. |
| 4,134,028 | 1/1979 | Kosonocky. |
| 4,137,464 | 1/1979 | Heller et al. |
| 4,227,175 | 10/1980 | Newman. |
| 4,306,221 | 12/1981 | Jiang et al. |
| 4,306,300 | 12/1981 | Terman et al. |
| 4,326,192 | 4/1982 | Merril et al. |
| 4,329,679 | 5/1982 | Jensen. |
| 4,375,059 | 2/1983 | Schlig. |
| 4,408,231 | 10/1983 | Bushaw et al. |
| 4,471,341 | 9/1984 | Sauer. |
| 4,489,309 | 12/1984 | Schlig. |
| 4,821,036 | 4/1989 | Daffarn. |

*Primary Examiner*—Sharon D. Logan
*Attorney, Agent, or Firm*—Welsh & Katz, Ltd.

[57] ABSTRACT

A symmetric pipelined charge-mode analog to digital converter including a signal-reference CCD channel having a plurality of charge storage stages that are arranged in a serial configuration to carry the signal and reference charges, and a CCD digital channel. A set of two step comparators coupled to the signal-reference channel first senses and stores the signal charge and then senses and compares the reference charge to the signal charge. In the first stage, an initial reference charge is used, and in subsequent stages, an increment of one half the previous stage increment is added to the reference. In addition, at each stage, a charge increment equal to the previous reference increment is conditionally added to the signal charge and a corresponding bit in the digital channel is conditionally set responsive to the comparator. Thus, if the total signal charge is less than the total reference charge at a stage, the charge increment is added to the signal charge in the signal-reference channel, and a corresponding digital bit charge is zeroed in the digital channel. Conversely, if the total signal charge is larger than the told reference charge at a stage, the charge increment is not added to the signal charge and a corresponding digital bit charge is set to represent a one in the digital channel. One configuration provides a differential symmetric architecture wherein two signal-reference channels simultaneously feed a dual symmetric comparator providing enhanced symmetry thereby reducing threshold and offset sensitivity and susceptibility to environmental factors such as ionizing radiation.

8 Claims, 5 Drawing Sheets

CHARGE-MODE ANALOG TO DIGITAL CONVERTER

This is a continuation of application Ser. No. 784,277, filed Oct. 29, 1991 now U.S. Pat. No. 5,189,423, which is a continuation-in-part of application Ser. No. 07/560,949 filed Jul. 31, 1990 issuing Oct. 29, 1991 as U.S. Pat. No. 5,061,927.

BACKGROUND OF THE INVENTION

This invention relates generally to the field of analog to digital converters and more particularly to a pipelined charge-mode analog to digital converter suitable for integration with other charge-mode devices.

Analog to digital (A/D) converters are well known in the electronics art for converting analog signals to a digital representation of the analog signal primarily to permit digital processing, digital storage, and/or digital display of the signal. A typical type of prior art A/D converter utilizes a plurality of analog comparators that compare an analog input voltage to reference voltages and generate binary bits in accordance with the results of the comparison. Such voltage A/D converters do not convert the magnitude of a charge packet to a digital representation, but instead generate a digital representation of an input analog voltage. However, many analog devices (including sensors and charge couple devices), are charge-mode devices which provide an output which is in the form of a charge packet. Such prior art voltage A/D converters require additional charge to voltage converters to permit them to be used with charge-mode devices. The charge to voltage converters introduce additional error, power consumption, and complexity. Thus, prior art voltage A/D converters are not highly suitable for use in a charge-mode environment.

Charge-mode A/D converters are known in the art using ramp or successive approximation techniques. The ramp type A/D converters generate a digital representation of a charge packet by decreasing the depth of a potential well containing the signal charge in a step wise fashion and test each step for an overflow of the charge. This type of A/D converter tends to be slow, results in a loss of the input charge packet, is difficult to fabricate to provide accurate results, and is highly susceptible to environmental influences such as ionizing radiation. The successive approximation type of charge-mode A/D converter uses a plurality of serial digitizing stages. Each stage generates a successively lower order digital bit by comparing a reference charge to the signal charge packet and generating a binary digit in accordance with the result of the comparison. The prior art successive approximation charge-mode A/D converters are complex and difficult to fabricate so as to produce accurate results, are sensitive to threshold shifts, and susceptible to environmental factors, such as ionizing radiation.

Accordingly, it is an object of this invention to provide a novel high-speed and accurate charge-mode A/D converter.

It is another object of this invention to provide a novel symmetric successive approximation charge-mode A/D converter which operates in high speed pipelined mode and avoids non-linear summing inaccuracies.

It is another object of the invention to provide a novel symmetric, single-channel, successive approximation charge-mode A/D converter which substantially reduces inaccuracies due to threshold variations.

It is another object of the invention to provide a novel differential symmetric successive approximation charge-mode A/D converter with enhanced accuracy, speed, and radiation hardness.

Briefly, according to one embodiment of the invention, a charge-mode A/D converter is provided to permit direct conversion of a charge packet to a digital output word. The analog to digital converter comprises a signal charge input to provide for input of a signal charge into a charge channel having a plurality of serially coupled charge wells. A charge injection circuit is provided for selectively generating and injecting predetermined charges, including a reference charge into the charge channel. A two-step comparator is coupled to the charge channel for sensing the signal charge and the reference charge, and then comparing the signal charge and reference charge to generate a control signal responsive to the comparison. Means are provided for selectively adding a selected charge to the reference charge and switch means is provided for conditionally adding a selected charge to the signal charge responsive to the control signals. A digital channel is provided for generating a digital word responsive to the control signals.

In an alternative embodiment, a differential symmetric charge-mode analog to digital converter is provided including means configured in stages for carrying first and second substantially equivalent and independent streams of reference and signal charges sequentially from stage to stage. A comparator is provided for simultaneously comparing the signal to the reference charge from the first independent stream, and the reference to the signal charge from the second independent stream for each stage and for generating control signals in response thereto. Control circuitry is provided for controlling conditional addition of a selected charge to the signal charge at each stage and in each stream responsive to the control signals, and a digital channel is provided for generating a digital word representative of the signal charge responsive to the control signals.

A BRIEF DESCRIPTION OF THE DRAWINGS

The invention, together with further objects and advantages thereof, may be understood by reference to the following description taken in conjunction with the accompanying drawings.

DETAILED DESCRIPTION OF THE INVENTION

Figure 1:
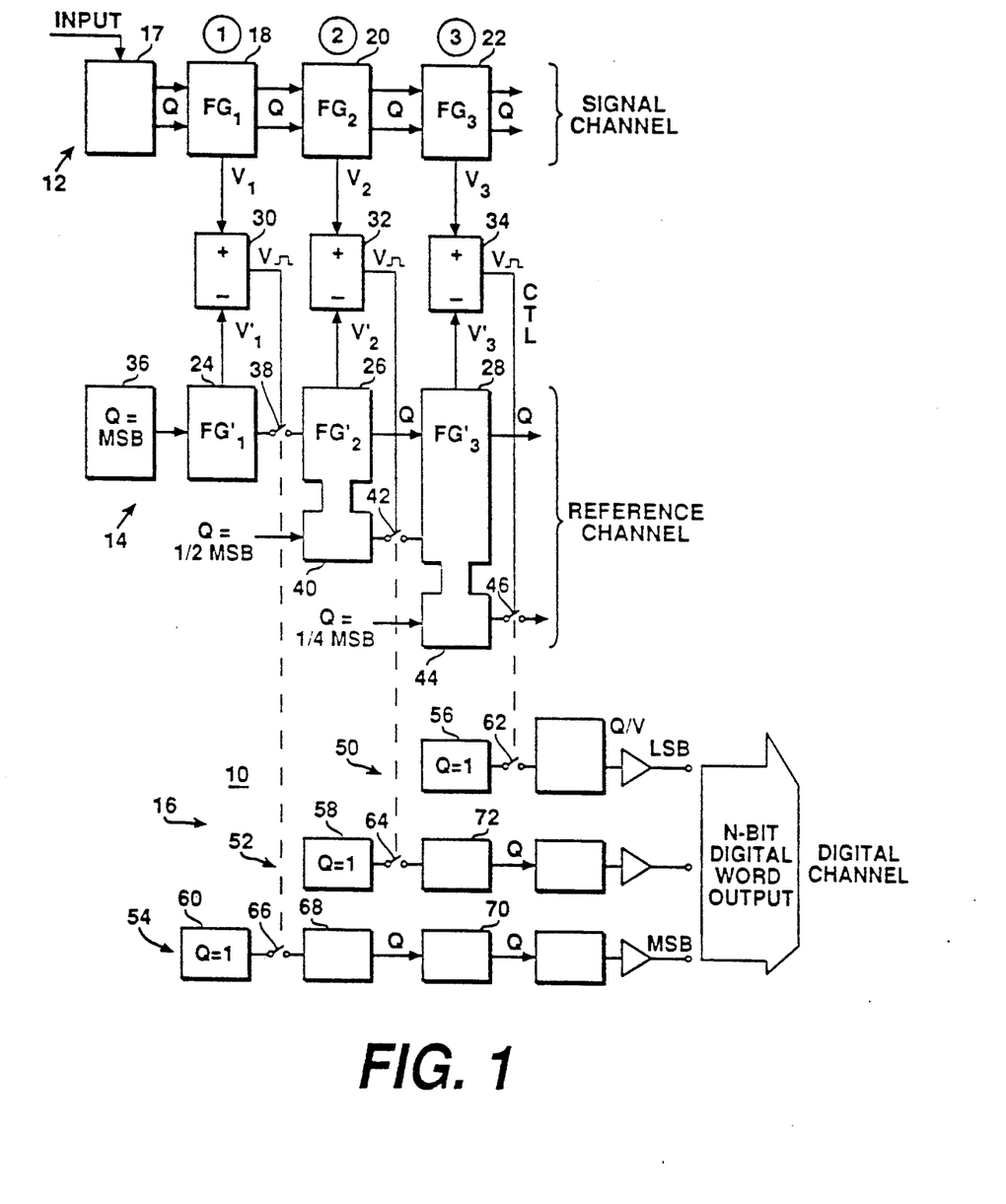
FIG. 1 is a detailed block diagram illustrating a specific embodiment of a charge-mode A/D converter according to the invention.

FIG. 1 is a detailed block diagram illustrating a specific embodiment of a charge-mode A/D converter 10 having a clocked, pipelined signal charge channel 12, a corresponding reference charge channel 14, and a digital channel 16. The signal channel 12 is composed of charge wells 18, 20, 22, and the reference channel 14 is composed of charge wells 24, 26, 28, arranged in three successive stages, as shown. The digital channel 16 comprises a series of charge wells also arranged in three successive stages corresponding to each stage of the reference and signal channels, as shown. These charge wells are formed using conventional charge coupled device (CCD) structures and fabrication techniques which are well known in the art. Each charge well is coupled to a corresponding charge to voltage latching comparator 30, 32, 34, as shown. As illustrated, only three stages are shown; however, this structure may be repeated to provide any number of stages to obtain any desired number of bits of digital output. The A/D converter of the invention has many applications including use in a floating point A/D converter such as that disclosed in patent application Ser. No. 07/560,949 which is hereby incorporated by reference.

In the first stage of the reference channel, a charge injection circuit 36, for injecting a charge equal to the most significant bit (MSB) of charge (i.e., one half the full scale charge value) is coupled to the charge well 24 which is coupled to the next stage charge well 26 via a switch 38 controlled by the comparator 30, as shown. In the second stage of the reference channel, a charge injection circuit 40 for injecting a charge equal to one half the MSB of charge, is coupled into the charge well 26, and is coupled to the next charge well 28 through a switch 42 controlled by the comparator 32, as shown. In the third stage of the reference channel, a charge injection circuit 44 for injecting a charge equal to one fourth the MSB of charge is coupled to the charge well 28 and is coupled to the next charge well through a switch 46 controlled by the comparator 34. In subsequent stages, the same structure would be provided with the injected charge values decreased by one half for each subsequent stage.

The digital channel 16 comprises three series sets of charge wells, which correspond to the first, second and third bits of the digital output, as shown. Thus, a bit channel 50, 52, 54 is formed for each output bit of the A/D converter from the most significant bit channel 54 to the least significant bit channel 50. A charge injection circuit 56, 58, 60 is coupled respectively to the first location of each bit channel 50, 52, 54 through a respective switch 62, 64, 66. Each of the switches 62, 64, 66 are coupled respectively to and controlled by the comparator 34, 32, 30, as shown. The same basic structure is repeated for any additional stages.

In operation, an input signal charge packet is coupled to the input charge well 18 of the signal channel 12 of the A/D converter 10. If the input signal is a voltage signal instead of a sampled charge packet, optional charge sampling circuitry 17 (e.g., a sampling voltage to charge converter) may be coupled to the input charge cell 18 to provide the input signal charge. This charge is compared by the latching comparator 30 to the charge equal to the MSB of the charge which is injected into the reference channel charge well 24. If the input signal charge is greater than the MSB reference charge, then the unit of charge (Q=1) from the charge injection circuit 60 is switched so that it can be clocked on the next clock cycle into the most significant bit charge well 68 of the most significant bit channel 54. This switching is performed by a control signal from the latching comparator 30 closing the switch 66, thereby permitting setting the MSB in the digital channel 16 on the next clock cycle. In addition, the MSB of charge is coupled to the next charge well 26 from the charge well 24 on the next clock cycle via the switch 38 which is closed by a control signal from the comparator 30. If the input signal charge is less than the MSB reference charge, the switch 66 and the switch 38 will be open in response to a control signal from the comparator 30. Thus, no unit charge will be introduced into the MSB channel 54, and the MSB reference charge in the charge well 24 will not be clocked to the next charge 26 on the next clock cycle.

Once the signals settle, all charge values are advanced one stage on the next clock cycle. Thus, the input charge in the charge well 18 is advanced to the next stage charge well 20, and if the switch 66 is closed, charge from the charge circuit 60 in the MSB channel 54 advances to the next stage charge well 68. The next input signal sample is also input into the first stage charge well 18 of the signal channel 12. Thus, a high speed pipelined capability is provided. The MSB of charge is loaded into the first stage reference charge well 24 and one half of the MSB of charge is added to the MSB reference charge if it has advanced to the second stage reference charge well 26. Otherwise, the one half MSB of charge is simply loaded into the reference charge well 26. All the charge increments in the charge injection circuits are also refreshed at this clock cycle.

During the second cycle, the first stage repeats operation, as previously described, on the next input signal charge packet, while the original input signal charge is now in the second stage charge well 20. The original input signal in charge well 20 is compared by the comparator 32 to the charge in the second stage reference charge well 26. Due to the injection of one half MSB of charge by charge circuit 40, this charge is one half of the MSB of charge or one and one half of the MSB of charge, depending on whether the MSB of charge from the first stage reference charge well 24 was clocked forward. The result is latched by the latching comparator 32. In a manner similar to that of the first stage, if the second stage signal charge in the signal charge well 20 is greater than the reference charge in the charge well 26, the latching comparator 32 will generate a control signal to close the switch 42 and the switch 64. This allows the entire reference charge, which is either one and one half times the most significant bit of charge or one half of the most significant bit of charge, to be advanced to the next stage reference channel well 28 on the next clock pulse. In addition, closing switch 64 allows a unit of charge to be advanced on the next clock pulse into the next digital bit well 72 of the digital bit channel 52 (i.e., the MSB minus one channel) of the digital channel 16. Conversely, if the reference charge in the charge well 26 is greater than the signal charge in the charge well 20, the comparator 32 will generate a control signal which opens the switches 64 and 42. The open switch 42 allows only the MSB of charge, if any, in the charge well 26 to be advanced to the next stage reference channel well 28, but not the one half of the most significant bit of charge, on the next clock cycle. In addition, the open switch 64 ensures that no unit charge will be introduced into the digital bit channel 52, representing a zero for the MSB minus one bit of the digital output.

The conversion then proceeds, on subsequent clock cycles, in the following stages in the same manner through all subsequent stages until full conversion has occurred. The result is that both the original sampled analog signal remains intact in the signal channel 12 at the end of the conversion process and a synthesized sampled analog signal is produced by the reference channel 14 which is within one half of the least significant bit of charge of the original signal. In addition, a parallel binary word representing the original signal in digital form is generated by the digital channel 16.

Figure 2:
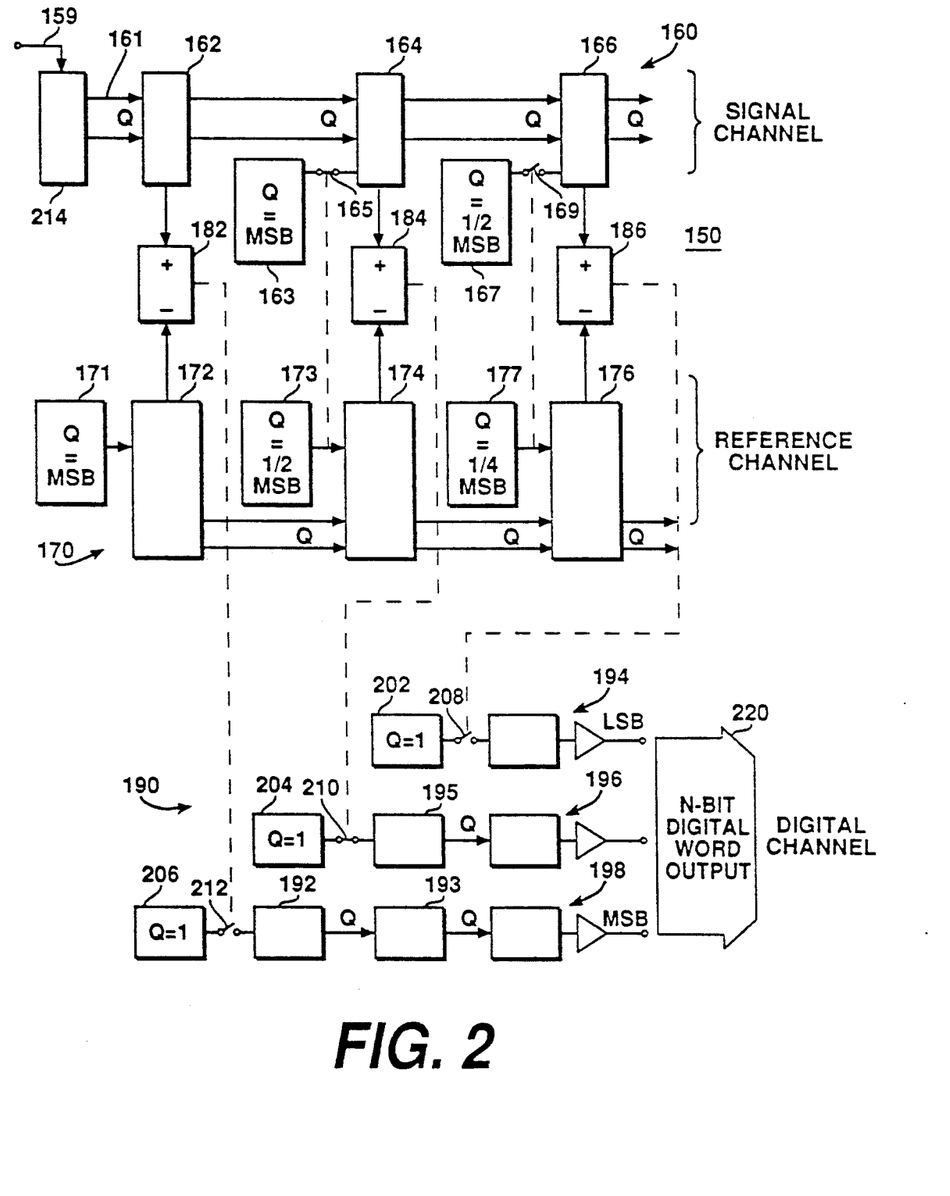
FIG. 2 is a detailed block diagram illustrating a specific embodiment of a symmetric charge-mode A/D converter according to the invention.

In order to minimize non-linear effects in the pipelined, charge-mode A/D converter 10 which can occur in the summing of the reference charge in the reference channel 14 with the fractional reference charge increments, a symmetric architecture may be utilized. Referring now to FIG. 2 there is shown a diagrammatic illustration of a basic architecture of a specific embodiment of a symmetric, pipelined, charge-mode A/D converter 150. The converter 150 comprises a signal channel composed of a clocked, pipelined CCD signal channel 160 composed of charge wells 162, 164, 166, and a corresponding reference CCD channel 170 composed of charge wells 172, 174, 176. These CCD channels are formed using conventional CCD structures and conventional CCD fabrication techniques such as are well known in the art. Each charge well is coupled to a corresponding charge to voltage latching comparator 182, 184, 186. Charge wells 162, 172 are coupled to the latching comparator 182 to form a first stage, charge wells 164, 174 are coupled to the latching comparator 184 to form a second stage, and charge wells 166, 176 are coupled to the latching comparator 186 to form a third stage, as shown. As indicated, although only three stages are shown, this structure may be repeated to provide any number of stages to obtain any desired number of bits of digital output.

In the second stage, a charge injection circuit 163 for injecting a charge (Q) equal to the MSB of charge is coupled through a switch 165 to the charge well 164. The switch 165 is coupled to and controlled by the comparator 182, as shown. Similarly, a charge injecting circuit 167 for injecting a charge equal to one half the MSB of charge is coupled through a switch 169 to the charge well 166. The switch 169 is coupled to and controlled by the comparator 184. In subsequent stages the same structure would be provided with the injected charge values decreasing by one half for each subsequent stage.

In the reference channel 170, a reference charge injecting circuit 174 for injecting a charge equal to the MSB of charge is coupled to the first stage charge well 172, a reference charge injecting circuit 173 for injecting a charge equal to one half of the most MSB of charge is coupled to the charge well 174 and a reference charge injecting circuit 177 for injecting a charge equal to one fourth of the MSB of charge is coupled to the charge well 176, as shown. A digital output channel 190 is provided in which a set of charge cells corresponding to the first, second and third stages form a bit channel 194, 196, 198 for each output bit of the A/D converter from the MSB to the least significant bit (LSB), as shown. A charge injection circuit 202, 204, 206 is coupled respectively to the first location of each bit channel 194, 196, 198, as shown, through a respective switch 208, 210, 212. Each of the switches 208, 210, 212 are coupled respectively to and controlled by the comparators 186, 184, 182. The same basic structure is repeated for additional stages with the reference charges decreased by one half for each subsequent stage. If the input signal is not a sampled charged signal, optional charge sampling circuitry 214 (e.g., a sampling voltage to charge converter) may be coupled to the input 161 of the first stage of the signal channel 160.

In operation, a sample charge is coupled to the input 161 of the A/D converter 150 and is coupled into the first stage signal channel charge well 162. This charge is compared by the latching comparator 182 to the charge equal to the MSB of charge which is injected into the reference channel charge well 172. If the input signal charge is greater than the MSB reference charge then the unit of charge (Q=1) is switched into the charge well 192 of the MSB channel 198 in the digital channel 190 from the injection circuit 206 by a control signal from the latching comparator 182 controlling the switch 112 thereby setting the MSB. In addition, the switch 165 will be opened by the comparator 182 preventing the charge from the circuit 163 from being added to the input signal charge. If the input signal charge is less than the MSB reference charge, no unit charge is introduced to the MSB channel 198 because the comparator 182 opens the switch 112 but the switch 165 is closed by the comparator 182 thereby adding a charge equal to the MSB of charge to the input signal charge on the next clock cycle.

Once the signals settle, on the next clock cycle, all charge values are advanced one stage. Thus, the input signal charge in the charge well 162 is advanced to the charge well 164, the charge in the charge well 172 is advanced to the charge well 174, and the charge in the first charge well in the MSB channel 198 advances to the next stage charge well 193. In addition, the next input signal charge sample is input into the first stage charge well 162, the MSB charge from the circuit 163 is added to the signal charge in the charge well 164 if the switch 165 has been closed by the latching comparator 182, one half of the MSB of charge is added to the reference charge in the second reference charge well 174, and the MSB of charge is loaded into the first stage reference charge well 172. All the charge increments in the charge injection circuits are also refreshed.

During this second cycle the first stage repeats operation as previously described on the next input signal charge packet while the original input signal charge is now in the second stage charge well 164, wherein the MSB increment charge may have been added if the switch 165 was closed. This sum of charge is compared to one and a half of the MSB of charge in the reference charge well 174 and the result is latched by the latching comparator 184. In a manner similar to the first stage, if the signal charge sum in charge well 167 is greater than the reference sum in charge well 174, the latching comparator 184 will close the switch 210 and open the switch 169 so that the unit charge is introduced into the next bit channel 196 (i.e., MSB minus one) of the digital channel 190 and so that no charge will be added to the input signal charge at the next stage. If the signal charge sum is less than the reference sum, the switch 210 will be opened and the switch 169 will be closed to add one half of the MSB of charge to the input signal charge and so that no charge is introduced into the bit channel 196. Conversion then proceeds in the following stages in the same manner through all stages for full conversion. The result is that both the original sampled analog signal and the reference tend toward full scale while a parallel binary word representing the original signal in digital form is developed and output on the output digital channel 220.

Figure 3:
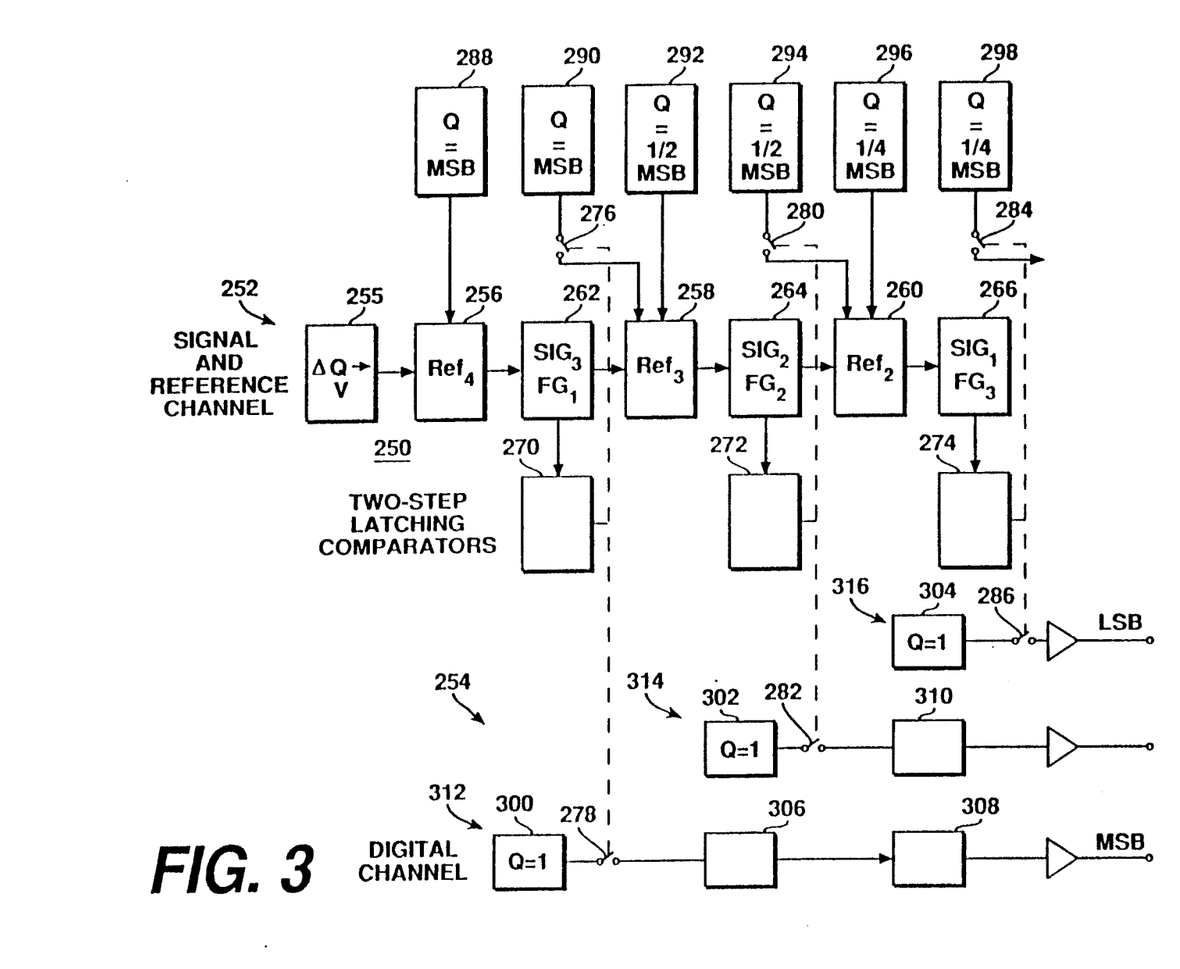
FIG. 3 is a detailed block diagram illustrating a specific embodiment of a symmetric, single-channel, charge-mode A/D converter to the invention.

To provide reduced sensitivity to threshold shifts and thus to environmental factors, a symmetric single-channel embodiment of the charge-mode A/D converter may be utilized. FIG. 3 is a detailed block diagram illustrating a specific embodiment of a symmetric, single-channel charge-mode A/D converter 250 comprising a clocked, CCD signal-reference serial charge channel 252, and a digital channel 254. The signal-reference channel 252 comprises charge wells 256, 258, 260, 262, 264, 266 coupled in series in three stages, as shown. The digital channel 254 comprises a series of charge injection circuits 300, 302, 304 and charge wells 306, 308, 310, corresponding to each of the stages, as shown. Each signal charge well is coupled respectively to a two-step latching comparator 270, 272, 274, as shown. The comparator 270 is coupled to two switches 276, 278, the comparator 272 is coupled to two switches 280, 282, and the comparator 274 is coupled to two switches 284, 286. Coupled respectively to each of the reference and signal charge wells is a charge injection circuit 280, 290, 292, 294, 296, 298, as shown. These charge wells, switches, and charge injection circuits are formed using conventional CCD structures and fabrication techniques which are well known in the art. As illustrated, only three stages are shown. However, this structure may be repeated to provide any number of stages to obtain any desired number of bits of digital output.

In the first stage of the signal-reference channel 252, a charge injection circuit 288, for injecting a charge equal to the MSB of charge is coupled to the charge well 256. A similar charge injection circuit 290 is coupled to the charge well 258 through the switch 276 which is controlled by the comparator 270, as shown. In the second stage of the signal-reference channel, a charge injection circuit 292, for injecting a charge equal to one half of the MSB of charge, is coupled to the charge well 258. A similar charge injection circuit 294 is coupled to the charge well 260 through a switch 280 which is controlled by the comparator 272, as shown. In the third stage of the signal-reference channel, a charge injection circuit 296 for injecting a charge equal to one fourth of the MSB of charge is coupled to the charge well 260 and a similar charge injection circuit 298 couples to the next stage charge well through the switch 284 which is controlled by the comparator 274, as shown. In subsequent stages, the same structure would be provided with the injected charge values decreased by one half for each subsequent stage.

The digital channel 254 comprises three sets of series charge wells which correspond to the first, second and third bits of the digital output. Thus, a bit channel 312, 314, 316 is formed for each output bit of the A/D converter from the MSB channel 312 to the LSB channel 316. The charge injection circuits 300, 302, 304 are coupled respectively to the first location of each bit channel 312, 314, 316 through a respective switch 278, 282, 286. Each of the switches 278, 282, and 286 are coupled respectively to and controlled by the comparators 270, 272, 274. The same basic structure is repeated for additional stages providing additional bits of digital resolution.

In operation, an input signal charge packet is coupled into the first charge well 256 of the signal-reference channel 252 either directly from a charge-mode device or from an optional voltage to charge converter 255. This charge is then clocked to the next charge well 262 while the reference MSB of charge is coupled from the charge circuit 288 into the charge well 256. The signal charge and the charge well 262 is then sensed and stored by the comparator 270. Each of the charges are then clocked to the next charge well so that the original signal charge is clocked into the charge well 258, the reference charge is clocked into the next charge well 262 and the next signal charge is coupled into the first charge well 256. Next, the MSB reference charge in the charge well 262 is sensed and compared to (i.e., subtracted from) the signal charge by the comparator 270 to generator a control signal to control the switches 276, 278. If the input signal charge is greater than the MSB reference charge, then the control switch 278 is closed, coupling the charge injection circuit 300 to the charge well 306 of the MSB channel 312 in the digital channel 254, by the control signal from the comparator 270, thereby permitting the setting of the MSB in the digital channel on the next clock cycle. In addition, the switch 276 is opened by the control signal from the comparator 270, preventing the MSB of charge from the circuit 290 from being added to the input signal charge in the charge well 258. If the input signal charge is less than the MSB reference charge, no unit charge is introduced to the MSB channel 312 because the comparator 270 opens the switch 278 and the switch 276 is closed by the comparator control signal from the comparator 270, thereby adding a charge equal to the MSB of charge to the input signal charge.

On the next clock cycle, all charge values are advanced to the next charge well. Thus, the new input signal charge in the charge well 256 is advanced to the charge well 262 and the MSB of reference charge is coupled into the charge well 256 while the charge in the charge well 258 is clocked to the next charge well 264. In addition, the reference charge in the charge well 262 is advanced to the charge well 258 where one half MSB of charge is added to it. During this cycle, the first stage repeats operation as previously described wherein the comparator first senses and then stores the signal charge, then performs the comparison on the next clock cycle. The second stage performs the same operation of comparing the signal and reference charges and controlling the switches 282 and 280 with the comparator generated control signals. As a result, the same algorithm is implemented as previously described with regard to FIG. 2.

Figure 4:
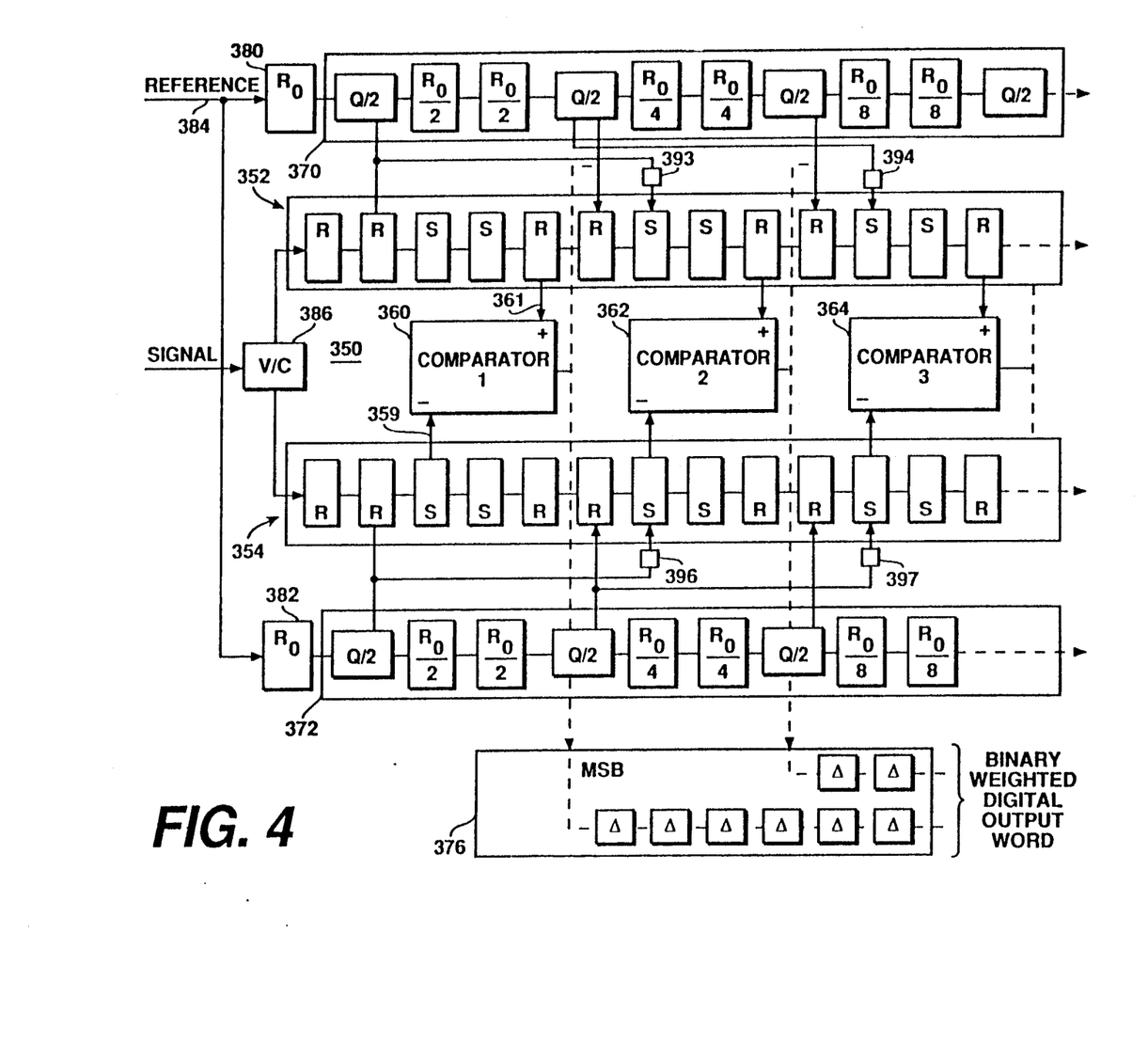
FIG. 4 is a detailed block diagram illustrating a specific embodiment of a differential symmetric charge-mode A/D converter according to the invention.

FIG. 4 is a detailed block diagram illustrating a specific embodiment of a differential symmetric charge-mode A/D converter 350 (e.g., the illustrated embodiment may be implemented as a twelve bit A/D converter) which is substantially a combination of two symmetric single channel charge-mode A/D converters, each substantially identical to that illustrated in FIG. 3. Thus, there are two CCD signal-reference channels 352, 354, each comprising series reference and signal charge wells, such that each corresponds to the signal-reference channel 252 of FIG. 3. In the illustrated embodiment, double copies of each charge packet are used to improve charge transfer efficiency. The two signal reference channels 352, 354 share comparators 360, 364 and 366 with one for each stage as illustrated in FIG. 3. Thus, each stage of the signal-reference channels 352, 345, is respectively coupled to the same comparator 360, 362, 364 in substantially the same manner that each stage of the signal-reference channel 352 of FIG. 3. couples to its respective comparator.

Each signal-reference channel 352, 354 also has CCD charge injection circuits coupled to appropriate signal and reference charge wells, as shown. In the embodiment of FIG. 4, the charge injection circuits are implemented using charge splitter circuits which sequentially split a reference input charge to obtain the necessary MSB, one half MSB, etc., charges. This splitting function is performed by splitter channels 370, 372, which comprise a series of CCD charge splitters. These charge splitters may be constructed using conventional CCD charge splitters wherein a barrier gate physically separates the charge packet into two charge packets. The splitter charges are then coupled as required to the reference and signal charge wells of the signal-reference channels 352, 354, as shown. The coupling of the respective charges from the splitter channel 370, 372 to the signal charge wells of the signal-reference channels 352, 354 is controlled by switches 393, 394, 396, 397, responsive to control signals coupled from the comparators 360, 362, 364. In addition, the control signals from the comparators 360, 362, 364 control the loading of bit charges in the digital channels 376 which corresponds to the digital channel 254 illustrated in FIG. 3.

A reference charge is coupled to each of the splitter channels 370, 372 from a respective voltage to charge converter 380, 382, as shown. The voltage to charge converters 380, 382 convert an input reference voltage from a reference input 384 to an initial reference charge ($R_o$) corresponding to the MSB of charge. This reference charge is coupled to the splitter channels 370, 372 which sequentially divide the charge to provide the required charge for injection into the signal and reference charge wells of the signal-reference channels 352, 354. Similarly, an input charge is coupled directly or an input voltage signal is converted to a charge by a voltage to charge converter 386 which then couples this input signal charge, to the first stage of each of the signal-reference channels 352, 354. These charge wells, switches, splitters, are formed using conventional CCD structures and fabrication techniques which are well known in the art. As illustrated, only three stages are actually shown, while all subsequent stages are identical.

The signal-reference channels, as illustrated, utilize twice as many charge wells to accommodate two charge packets for each represented charge. Thus, each charge is loaded in identically twice in order to increase precision and increase charge transfer efficiency. Because the charge transfer process is imperfect, some charge is left behind upon transfer of each charge from one charge well to the next. However, the charge lost by the first charge packet through the channel is gained by the next charge packet. This phenomenon may optionally be used to advantage as in the illustrated embodiment, using the trailing bit technique. When two adjacent and identical charge packets are transferred, the charge gained is exactly equal to the charge lost by the trailing charge packet. Thus, by using the trailing charge packet as the signal or reference charge, a high accuracy and high charge transfer efficiency is provided.

Each signal-reference channel 352, 354 otherwise operate substantially the same as the signal-reference 252 channel described with reference to FIG. 3. In operation, the input sample charge packet is coupled into the first charge well for each signal-reference channel 352, 354 from the charge input circuit 386. That charge is clocked forward to the next charge well and the same charge is repeated to provide a dual input charge wherein the trailing charge will be used as the signal charge. These charges are then clocked to the third and fourth charge well positions while the reference MSB of charge is injected into the second charge well to provide the reference charge. This is repeated on the next clock forwarding the charges one position and injecting an identical trailing edge reference charge and a new input signal charge. This operation continues with the input signal charge injected twice, followed by reference charge injected twice to provide pipelined operation and the trailing bit to maximize charge transfer efficiency. Optionally, a single-bit structure may be used.

Once the first signal charge reaches the positive input 361 of the first comparator 360, the comparator 360 senses and stores the signal charge, and simultaneously senses and stores the reference charge on its negative input 359. Each of the comparators 360, 362, 364 is configured so that the order of the signal and reference charge is reversed on the positive and negative inputs. Consequently, two clock phases later, the comparator 360 will sense the reference charge at the positive input 361 and the signal charge at the negative input 369. Thus, the signal and reference charge from the upper channel 352 are sensed and compared through the positive input 361, and the reference charge and signal charge from the lower channel 354 are sensed and compared through the negative input 359. The comparing (i.e., substraction) of each is performed simultaneously resulting in a comparison result of A (S-R) for the upper channel, and A' (R-S) for the lower channel. These two results are applied to the positive (R) and negative (S) inputs of an R-S flip-flop to produce a control signal output. This results in driving the comparator with the signal 2A (S-R) if A is equal to A'. Because of the symmetry and close proximity of the comparator input stages, any offsets tend to track, thereby presenting a common mode signal to the comparator. This structure thus provides compensation for channel differences and threshold variations which reduce sensitivity to environmental influences such as ionizing radiation.

Once the comparator 360 has completed the two step comparison, a control signal is output to control the switch 393 and the binary channel 376. If the input signal charge is greater than the MSB reference charge, then the switch 392 is opened so that no charge is added to the signal charge in the seventh and eighth charge wells. In addition, a charge is injected into the MSB channel of the digital channel 376, setting the MSB to one as described with regard to FIGS. 2 and 3. If the input signal charge is less than the MSB reference charge, no unit charge is introduced to the MSB channel of the digital channel 376 and the switch 393 is closed by the comparator 360 control signal, thereby adding one half MSB of charge to the input signal charge. Subsequently, the reference charges are advanced to the sixth and seventh charge well positions, and a one half MSB of charge is unconditionally added to the reference. The same process is followed for the lower channel 354. Thus, the previously described algorithm, in which declining sized charge packets (i.e., successive reduced by the half) are added to the reference charge and conditionally added to the signal charge, is implemented in each channel 352, 354. This process is continued for each stage wherein any desired number of stages can be added to provide corresponding desired digital resolution (e.g., 12 bits of resolution can be implemented for the illustrated embodiment).

Figure 5:
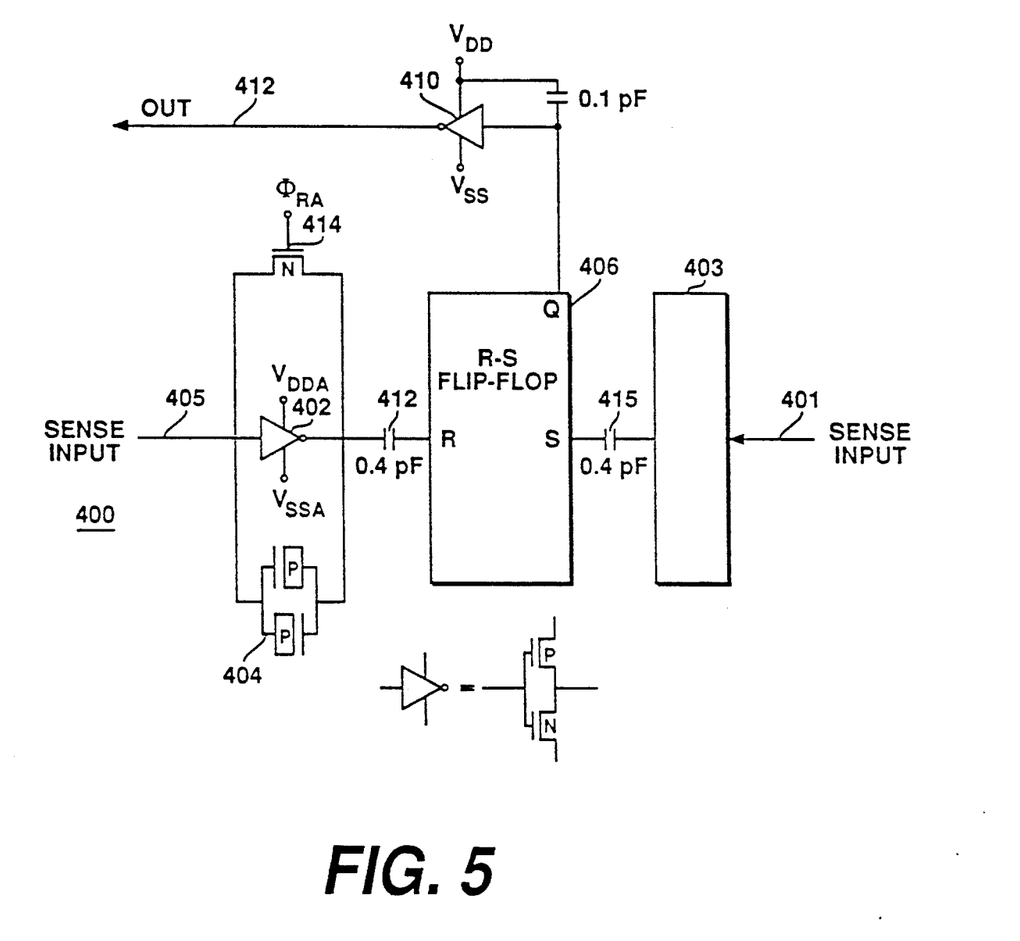
FIG. 5 is a schematic diagram illustrating a specific embodiment of a dual, two-step comparator suitable for use in the embodiment of FIG. 4.

Referring now to FIG. 5, there is shown a schematic diagram of a CMOS two step comparator 400 suitable for use as the comparators 360, 362, 364 in the embodiment of FIG. 4. The comparator 400 shown is a symmetric dual comparator with two identical charge comparator sections 401, 403. The charge comparator section 403 is not shown in detail as it is identical to the charge comparator section 401. If the section 403 is removed and the output of comparator 401 is coupled through an inverter to the S input, a single two-step comparator is provided suitable for use as the comparators 270, 272, 274 in the embodiment of FIG. 3.

A sense input 405 of the charge comparator 401 couples the input charge to the charge to voltage converter 402, which converts the charge to a voltage and temporary stores the voltage results in a non-linear capacitor 404. A reset FET 414 is provided which is controlled by a reset signal. When the second (reference) charge is sensed, the non-linear capacitor functions to subtract the two signals and a resultant pulse is coupled through a capacitor 412 to the R input of the RS flip flop 406. The result of the charge comparator 403 is similarly coupled to the S input of the RS flip flop 406 through a capacitor 415, the output of which is coupled to the output buffer 410, as shown. The output of the RS flip flop constitutes the comparator control signal, which is amplified by the buffer 410 and coupled to the charge control switches via an output 412. Because of the symmetry and close proximity of the two comparator input stages 402, 403, any offsets or threshold shifts that may develop will tend to track, presenting a common-mode signal to the CMOS comparator. This minimizes sensitivity to environmental factors such as ionizing radiation.

The embodiment of FIG. 4 may be implemented, for example, using a standard CMOS process with a buried channel implant to fabricate the CCD structures including the CCD splitters, CCD channels, comparators, and clock generators, using conventional NFET, PFET, buried channel CCD, and surface channel CCD structures. Thus, for example, the charge channels 352, 354 of FIG. 4 may be implemented as buried channel CCD structures, the splitter channels 370, 372 may be implemented as surface channel CCD structures, and the digital channel 376 may be implemented as either type of CCD or as a CMOS structure.

The fabrication steps for the buried channel CMOS process of this example may use a p-type silicon substrate with less than $10^{15}$ impurities per $cm^2$. An N-Well is created by implanting phosphorus where the N-Well mask has been defined. A drive-in is performed which pushes the implant deep into the substrate while at the same time growing the field oxide. This is done in an oxygen atmosphere at 1000° C. for 35 minutes. Then it is baked in a hydrogen oxygen atmosphere at 1105° C. for 45 minutes. Further baking is done at 1105° C. for 10 minutes and 1000° C. for 40 minutes in a nitrogen atmosphere. A nitride mask prevents regions which will be used to create the devices from being oxidized. Buried channel regions are defined in this way with no drive in step. Thus, a buried channel implant of phosphorus is implanted deep into the p-type substrate. This is done with a phosphorus dose of $1.7 \times 10^{12}$ and an implant energy of 180 KeV. These regions are used for the buried channel CCD's.

The next step defines the gate and FET regions. After the nitrogen layer is removed, a gate oxide is grown with which to isolate the gate from the channel. Polysilicon is deposited over the entire wafer and then regions defined by the a 1 mask are etched away leaving the poly interconnect lines and the poly 1 gate regions. A thin gate oxide is grown again. Polysilicon is deposited over the entire wafer and then portions defined by poly 2 mask are etched away leaving poly 2 interconnects and gate regions.

Next, the n+ and p+ regions are defined which create the source and drain. An NFET is created by implanting n+ around a polysilicon gate which lies over the p-type substrate. A PFET is created where p+ is implanted around a polysilicon gate which lies over an n-well. Substrate contacts are created by implanting p+ over the p-type substrate. N-Well contacts are created by implanting n+ over an n-well. Both n+ and p+ regions have an impurity concentration of over $10^{20}$ impurities per $cm^2$.

CCD regions are created by overlapping poly 1 and poly 2 over the p-type substrate. The beginning and end of the CCD has a n+ regions which is used to either put charge into the CCD or remove charge from the CCD. Buried channel CCD's are created over locations where a buried channel implant was performed. Surface channel CCD's are created over p-type silicon regions where there is no buried channel implant.

The metal interconnect is next defined over the devices built onto the substrate. Two metal layers are used in this process. First a passivation layer is deposited over the surface of the devices to insulate them from the metal layers. Then, holes are etched in the passivation layer so that the metal which is deposited into the hole contacts either the polysilicon, p+ or n+ regions. The metal is deposited over the entire wafer and then selectively etched away from regions defined by the metal 1 mask. Another insulation layer is deposited over the wafer so that the second metal layer can be put in place. Holes are etched in the second layer to make contact with the first metal 1 layer. Metal 2 is deposited over the wafer and then selectively etched off as defined by the metal 2 mask. A final insulation layer is deposited over the entire wafer.

In this example of the embodiment of FIG. 4, the buried channel CCD structures and FET structures may have dimensions as follows:

| | |
|---|---|
| 1. Minimum active width | 3 microns |
| 2. Minimum active to other active | 3 microns |
| 3. Minimum overlap of polysilicon to active | 3 microns |
| 4. Minimum poly 1 to poly 2 overlap over active | 1.5 microns |
| 5. Minimum poly 1 width | 2 microns |
| 6. Minimum poly 1 to other poly 1 | 2.5 microns |
| 7. Minimum poly 2 width | 2 microns |
| 8. Minimum poly 2 to other poly 2 | 3 microns |

Specific embodiments of the novel charge-mode analog to digital converter have been described for the purpose of illustrating the manner in which the invention may be made and used. It should be understood that implementation of other variations and modifications of the invention in its various aspects will be apparent to those skilled in the art and that the invention is not limited by the specific embodiments described. It is therefore contemplated to cover by the present invention any and all modifications, variations or equivalents that fall within the true spirit and scope of the underlying principles disclosed and claimed herein.

What is claimed:

1. A charge-mode analog to digital converter comprising:
   a signal charge input adapted for input of a signal charge;
   a charge channel coupled to the signal charge input having a plurality of serially coupled charge wells;
   a reference channel having a plurality of serially coupled charge wells;
   charge injection means for selectively injecting predetermined charges including a reference charge into the reference channel;
   comparator means coupled to the charge channel and the reference channel for sensing the signal charge and the reference charge, and for comparing the signal charge to the reference charge to generate control signals, responsive thereto; and
   a digital channel for generating a digital word responsive to the control signals wherein the digital word further includes digital bits such that each digital bit corresponds to an analog to digital conversion stage.

2. The analog to digital converter of claim 1 further comprising:
   reference channel switch means for conditionally adding a selected charge to the reference charge responsive to the control signals; and
   digital channel switch means for conditionally adding a selected charge to the digital charge responsive to the control signals.

3. The analog to digital converter of claim 2 wherein the selected charge added to the reference charge for a first analog to digital conversion stage is equal to a most significant bit charge and the selected charge added to the reference charge for a subsequent analog to digital conversion stage is equal to one half of the charge added to the first analog to digital conversion stage.

4. The analog to digital converter to claim 2 wherein the selected charge added to the digital charge is equal to the charge of a most significant bit.

5. A differential symmetric charge-mode analog to digital converter comprising:
   means configured in stages for carrying first and second substantially equivalent and independent streams of reference charges and signal charges sequentially from stage to stage;
   comparator means for simultaneously comparing the signal charge to the reference charge from the first independent stream and the reference charge to the signal charge from the second independent stream for each stage and for generating control signals in response thereto;
   control means for controlling conditional addition of a selected charge to the signal charge at each stage and in each independent stream responsive to the control signals;
   means for generating a digital word representative of the signal charge responsive to the control signals.

6. The analog to digital converter of claim 5 wherein the control means for controlling conditional addition of a selected charge to the signal charge further comprises:
   charge splitter means for selecting a fractional charge.

7. The analog to digital converter of claim 6 wherein the charge splitter means selectively splits an input charge in half for selective transmission to a subsequent stage.

8. The analog to digital converter of claim 5 wherein the means for carrying first and second substantially equivalent and independent streams of reference charges and signal charges further comprises two parallel series of charge wells, and wherein each signal and reference charge is stored substantially identically in adjacent charge wells as a leading and trailing charge such that the trailing charge is utilized by the comparator means and the control means.

* * * * *

UNITED STATES PATENT AND TRADEMARK OFFICE
CERTIFICATE OF CORRECTION

PATENT NO. : 5,327,138
DATED : July 5, 1994
INVENTOR(S) : Linnenbrink et al.

It is certified that error appears in the above-indentified patent and that said Letters Patent is hereby corrected as shown below:

Column 1, line 4, please insert a statement of interest as follows:

--The U.S. Government has a paid-up license in this invention and the right in limited circumstances to require the patent owner to license others on reasonable terms as provided for by the terms of Air Force Contract No. F29601-87-C-0217.--

Signed and Sealed this

Twentieth Day of June, 1995

*Attest:*

BRUCE LEHMAN

*Attesting Officer*     *Commissioner of Patents and Trademarks*